(12) United States Patent
Ch'ng et al.

(10) Patent No.: US 7,633,815 B2
(45) Date of Patent: Dec. 15, 2009

(54) FLEXIBLE WORD LINE BOOSTING ACROSS VCC SUPPLY

(75) Inventors: Chin-Ghee Ch'ng, Gelugor (MY); Sheau-Yang Ch'ng, Penang (MY)

(73) Assignee: Spansion LLC, Sunnyvale, CA (US)

( * ) Notice: Subject to any disclaimer, the term of this patent is extended or adjusted under 35 U.S.C. 154(b) by 85 days.

(21) Appl. No.: 11/951,263

(22) Filed: Dec. 5, 2007

(65) Prior Publication Data

US 2009/0147585 A1   Jun. 11, 2009

(51) Int. Cl.
   *G11C 7/00* (2006.01)
(52) U.S. Cl. .......................... 365/189.11; 365/189.07; 365/189.09
(58) Field of Classification Search ............ 365/189.11, 365/189.07, 189.09, 226; 323/267, 274, 323/277, 280; 327/540–541
   See application file for complete search history.

(56) References Cited

U.S. PATENT DOCUMENTS

| | | | |
|---|---|---|---|
| 7,319,312 B2 * | 1/2008 | Leung et al. ............... 323/285 |
| 7,428,159 B2 * | 9/2008 | Leung et al. ............... 363/95 |
| 2006/0023781 A1 * | 2/2006 | Leung et al. ............... 375/238 |
| 2006/0033650 A1 * | 2/2006 | Leung et al. ............... 341/143 |
| 2006/0220938 A1 * | 10/2006 | Leung et al. ............... 341/155 |

* cited by examiner

*Primary Examiner*—Gene N. Auduong
(74) *Attorney, Agent, or Firm*—Turocy & Watson, LLP

(57) ABSTRACT

Systems and methods for producing a boosted voltage which can be used as a boosted word line voltage for read mode operations of memory cells are disclosed. The system contains a VCC comparator, a look up table, and a boosting circuit including a set of boosting capacitors. The look up table has a list of trim codes that indicates desired boosting ratios. The boosting ratio can vary depending on a level of a supply voltage to provide a sufficient word line voltage, thereby preventing and/or mitigating delay in reading operations. The number of the capacitors in the boosting circuit can be predetermined to be turned on or off according to the trim code. Accordingly, the voltage boost circuit provides a sufficient boosted word line voltage to a core cell gate with flexibility despite fluctuation of the supply voltage level.

20 Claims, 3 Drawing Sheets

FLEXIBLE WORD LINE BOOSTING ACROSS VCC SUPPLY

TECHNICAL FIELD

Disclosed are systems and methods for producing a boosted voltage which can be used as a boosted word line voltage for read mode operations of memory cells.

BACKGROUND

A wide variety of memory devices can be used to maintain and store data and instructions for various computers and similar systems. In particular, flash memory is a type of electronic memory media that can be rewritten and that can retain content without consumption of power. Unlike dynamic random access memory (DRAM) devices and static random memory (SRAM) devices in which a single byte can be erased, flash memory devices are typically erased in fixed multi-bit blocks or sectors. Flash memory technology can include NOR flash and NAND flash, for example. NOR flash evolved from electrically erasable read only memory (EEPROM) chip technology, in which, unlike flash, a single byte can be erased; and NAND flash evolved from DRAM technology. Flash memory devices are less expensive and denser as compared to many other memory devices, meaning that flash memory devices can store more data per unit area.

NOR Flash memory architecture is an array of Flash EEPROM cells (floating gate devices) which are divided into a plurality of sectors. Further, the memory cells within each sector are arranged in rows of wordlines and columns of bitlines intersecting the rows of wordlines. The source region of each cell transistor within each sector is tied to a common node. Therefore, all of the cells within a particular sector can be erased simultaneously and erasure may be performed on a sector-by-sector basis. The control gates of the cell transistors are coupled to wordlines, and the drains thereof are coupled to bit lines.

Flash memory devices can include a number of sectors that can include word lines and bit lines associated with memory cells to or from which data can be written and/or read. Each sector can include a plurality of memory cells. Further, each sector can include a boost-strap node to which a voltage can be applied in order to facilitate writing or reading data to/from the flash memory. During a read operation, a voltage source can supply a voltage, so that the respective voltage levels at the boost-strap nodes respectively associated with each of the sectors can be increased to a desired voltage level. The boost-strap node can facilitate enabling the signal at the vertical word line to pass to the memory cell word line to facilitate the reading of data from the memory cell associated with the memory cell word line. The desirable amount of time to raise the boost-strap node voltage to the desired voltage level can be limited. Further, parasitic elements can delay the increase of the voltage level in the boost-strap nodes and/or introduce inconsistencies between the voltage ramp rates of the boost-strap nodes of respective sectors, where such parasitic elements can include resistance in the channel associated with the boost-strap nodes as well as stray capacitance, which can result from the routing of the circuitry in the device.

As is generally known in the field of semiconductor memory devices and other semiconductor integrated circuits, it is often required to generate internally voltages that are greater than an external voltages, also known as off-chip power supply voltages. For example, it is known in flash EEPROMs that a first high voltage of about +5V is needed to be produced for the read mode of operation of memory cells. Also, a second high voltage of about +10V is needed to be produced for the program mode of operation of the flash memory cells. To meet this requirement, the semiconductor memories also generally include one or more internal voltage boosting circuits for generating output signals boosted to be higher than an external supply voltage.

Conventional boosted voltage circuits generate a boosted voltage and apply the boosted voltage to a word line for read mode operations of memory cells. In such conventional boosted voltage circuit, the boosted voltage varies with supply voltage levels, process corners, and temperature. Thus, the boosted voltage is not accurate and causes errors to occur during read mode operations of memory cells. Such variations of the boosted voltage degrade an ability in a read mode circuitry to discriminate accurately whether or not a cell is programmed. In addition, as device densities and memory speed requirements continue to increase, a speed requirement of the boosted voltage circuit may need to increase to keep pace with a remainder of the memory circuit. Further, as supply voltage levels decrease with the higher density architectures, conventional boosted voltage circuits may be inadequate to supply a required boost voltage.

SUMMARY

The following presents a simplified summary of the innovation disclosed herein in order to provide a basic understanding of some aspects of the innovation. This summary is not an extensive overview of the innovation. It is intended to neither identify key or critical elements of the innovation nor delineate the scope of the innovation. Its sole purpose is to present some concepts of the innovation in a simplified form as a prelude to the more detailed description that is presented later.

One aspect of the innovation provides systems and methods of trimming up and down a word line voltage level for read operations. The system contains a VCC comparator that translates a level of a supply voltage into bits digital codes. The innovation utilizes a look up table containing a list of bits trim codes. A list of bit trim codes indicate desired boosting ratios. The specific boosting ratio can vary depending on a level of supply voltage. According to the trim code, the look up table sends a different boosting ratio to a boosting circuit to boost the supply voltage for providing a sufficient word line voltage, thereby preventing and/or mitigating delay in reading operations. Lists of trim codes can be programmable in the look up table. The system contains a voltage boosting circuit that is operable to receive a command based on the trim code from the look up table and alter a boost gain of the boost circuit, thereby providing the desired voltage level to a core cell gate with flexibility despite fluctuation of the supply voltage level.

Another aspect of the innovation provides a method for preventing over boosting when a supply voltage is higher than a desired voltage for read mode of operations. When an amount of supply voltage is relatively high, the look up table commands the boosting circuit not to boost the supply voltage according to the trim code. This action prevents over boosting.

To the accomplishment of the foregoing and related ends, the innovation, then, comprises the features hereinafter fully described and particularly pointed out in the claims. The following description and the annexed drawings set forth in detail certain illustrative embodiments of the innovation. These embodiments are indicative, however, of but a few of the various ways in which the principles of the innovation may be employed. Other objects, advantages and novel features of the innovation will become apparent from the following detailed description of the innovation when considered in conjunction with the drawings.

DETAILED DESCRIPTION

Figure 1:
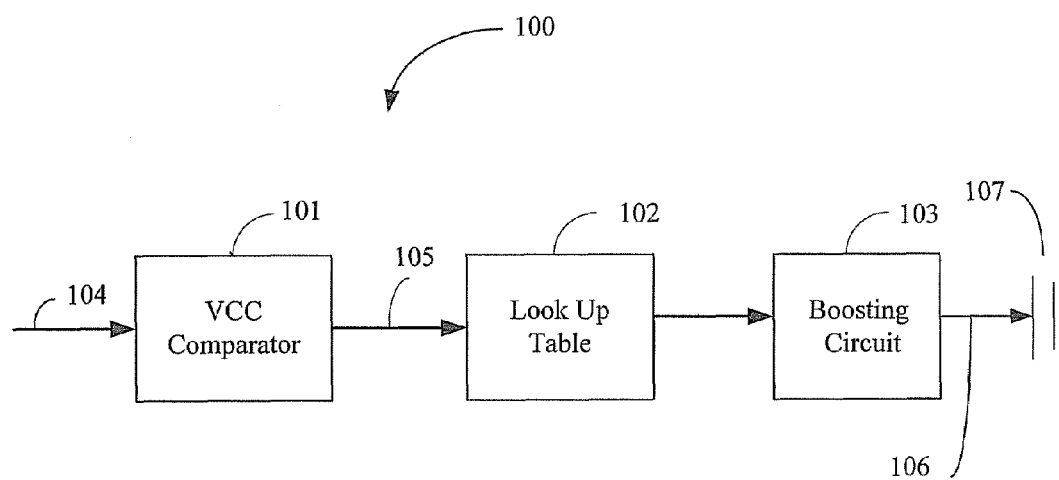
FIG. 1 illustrates operation of a voltage booster system in accordance with one aspect of the invention.

Memory devices, such as flash memory devices, are progressively increasing in density, and as a result, the number of sectors in a vertical word block of a flash memory device is increasing to facilitate achieving the desired density. Further, routing channels in memory devices are becoming more narrow and routing more compact to facilitate achieving higher density in memory devices. As a result, parasitic elements (e.g., undesirable resistance and capacitance) can become more problematic, and can increase the longer the distance a voltage source is from the destination to be supplied with the voltage.

Systems and/or methods are presented that facilitate countering the parasitic elements to facilitate performing read operations at a desirable speed to read data from memory. In order to perform a read operation, a voltage is applied to various terminals of memory cells in memory devices. Two problems may occur when reading memory cells undesirably increase the time duration of a read operation. The first problem is voltage undershoot. Undershoot occurs when a transistor does not have enough drain voltage to allow a necessary amount of current to pass through to other circuit components. When a pre-charge digital signal begins, there is not a desired amount of voltage in a transistor's drain terminal. The memory device usually must wait the length of time necessary for the voltage to reach the level necessary, or the memory device attempts to function with an insufficient voltage level.

Before describing a second problem, several assumptions are made. The supply voltage is VCC supply, the threshold voltage is optimum gate voltage supplied to the memory cell and tuned to cater for a balance sensed current margin for a digital 1 and 0, and the boosting ratio is the programmable boosting ratio. The boosting ratio is programmable as the trim code is easily changeable by product engineering. The second problem is voltage over boosting. Over boosting is caused by the application of too much voltage applied to the gate of the MOSFET or memory cell during a read operation. When the gate voltage is too high, the current drive increases and reading a stored digital 0 or 1 can be a problem in some instances.

There are a series of penalties if the supply voltage is too high or too low during the read mode. When the supply voltage is too high or too low, a word line voltage may also be too high or too low because the word line voltage is usually dependant on the supply voltage. If the word line voltage is too low or too high, a core cell current created by the varying word line voltage may degrade a current margin such that it becomes difficult to read a core cell date value. Consequently, the current margin to read a data value of 1 or 0 becomes smaller. When a supply voltage is not high enough to supply the voltages required to perform a read operation, the device is inoperative or inapplicable in certain systems. Therefore, the innovation disclosed and claimed herein, in one aspect thereof, provides a voltage booster system that produces a boosted voltage which can be used as a boosted word line voltage for read mode operations of memory cells specifically including non-volatile memory cells.

In order to get an acceptable reading margin for one and zero, a word line voltage needs to be from about 100 mV to about 200 mV in variation. To achieve such a variation, voltage regulation is needed. While a traditional single clock pulse booster with regulation is operating, offset can be eliminated by a switched capacitor method where the offset from the output is fed back to the input to fully cancel off the input offset. Such an operation requires effective timing in order to make this scheme work, especially the equalization of the 2 inputs to achieve a dc level at the output and the charge and discharge time of the capacitor.

The reading of information is accomplished by supplying a particular voltage (e.g., 9 volts, 2 volts, 1 volt, . . . ) across a selectively conductive media. The particular voltage, also referred to as a threshold voltage, varies according to a respective desired state and is generally substantially greater than voltages employed during normal operation. Thus, there is typically a separate threshold voltage that corresponds to respective desired states (e.g., "off", "on" . . . ). The threshold value varies depending upon a number of factors including the identity of the materials that constitute memory cells, the specific architecture and device layout, and the like.

Generally speaking, the presence of an external stimuli such as an supplied electric field that exceeds a threshold value ("on" state) permits a supply voltage to write, read, or erase information into/from a memory cell; whereas the absence of the external stimuli that exceeds a threshold value ("off" state) prevents an supply voltage to write or erase information into/from a memory cell.

By utilizing a VCC comparator, a look up table, and a boosting circuit including a set of boosting capacitors, a threshold value can be maintained throughout a read operation despite supply voltage variation in the memory cell. In cooperation, these components allow a higher degree of control and efficiency during reading of the memory cell. Eliminating the fluctuations of the supply voltage allows increased efficiency by providing a boosted word line voltage which is sufficient to allow read operations.

In order to obtain an optimal read time, the supply voltage for reading memory cells should reach a threshold voltage as quickly as possible. The threshold voltage is usually dependant on the supply voltage. One advantage of the boosting operation described herein is to improve the performance and reliability of providing a boosted voltage to a core cell gate when the supply voltage is lower than a threshold voltage during a read mode of operation. The boosting system described herein can provide increased accuracy and efficiency in reading memory devices by providing a desired voltage level to the core cell gate for read mode operations of memory cells. The boosting system described herein can provide more reliability in a read operation by providing a mean to control the voltage level of a word line voltage to allow the read operation.

Systems and methods disclosed herein translate a level of a supply voltage level to a digital code through a VCC comparator. The digital code is sent to a look up table. The look up table matches the digital code to a trim code. Trim codes indicate desired boosting ratios. The boosting ratios determine boosting capacitors settings in a boosting circuit. Thus, the look up table commands a boosting circuit to boost or not to boost the supply voltage based on the trim code wherein a predetermined set of capacitors are turned on or off according to the trim code (the boosting ratio). The systems may be able to generate a boosted voltage which can be used as a boosted word line voltage to a core cell's gate using the VCC comparator, the look up table, and the boosting circuit including a set of boosting capacitors.

The boosting systems and methods are now described with reference to the drawings, wherein like reference numerals are used to refer to like elements throughout. In the following description, for purposes of explanation, numerous specific details are set forth in order to provide a thorough understanding of the claimed innovation. It may be evident, however, that the claimed innovation may be practiced without these specific details. In other instances, well-known structures and devices are shown in block diagram form in order to facilitate describing the claimed innovation.

FIG. 1 illustrates operation of a voltage booster system 100. The system 100 can include a memory that can include non-volatile memory, such as flash memory, quad-bit flash memory, read only memory (ROM), programmable ROM (PROM), erasable programmable read only memory (EPROM), electronically erasable programmable read only memory (EEPROM), and the like.

The voltage booster system includes a VCC comparator 101, a look up table 102, and a boosting circuit 103. The VCC comparator 101 receives a supply voltage 104. The VCC comparator 101 can be used as an analog-to-digital converter.

An analog-to-digital converter (abbreviated A/D) is an electronic circuit that converts continuous signals to discrete digital numbers. Typically, an A/D is an electronic device that converts an input analog voltage (or current) to a digital number. The digital output may be using different coding schemes, such as binary and two's complement binary. The A/D converter is a device for converting information contained in the value or magnitude of some characteristic of an input signal, compared to a standard or reference, to information in the form of discrete states of a signal, usually with numerical values assigned to various combinations of discrete states of the signal. The VCC comparator 101 is used to transform analog information (e.g., a level of a supply voltage) into a form suitable for digital handling, which involves code conversion. Thus, the VCC comparator 101 measures the supply voltage 104 and translates a level of the supply voltage 104 to a digital code 105.

The digital code 105 of the VCC comparator 101 is a binary signal, and that binary signal encodes a level of a supply voltage 104. The digital code 105 is some sort of digital number (e.g., 1 or 0). The digital code 105 containing n bits is determined by the level of the supply voltage 104. Thus, the digital code 105 containing n bits represents the level of the supply voltage 104. For example, when a supply voltage 104 is 3V, that voltage is translated to a digital code 105 (e.g., '00110011', '00010001' . . . ) through the VCC comparator 101.

After the VCC comparator 101 translates the level of the supply voltage 104 to the digital code 105, then, the VCC comparator 101 sends the digital code 105 to a look up table 102. Then, the look up table 102 commands a boosting circuit 103 to boost or not to boost the supply voltage 104 by utilizing a desired boosting ratio. According to the boosting ratio, the boosting circuit 103 produces a boosted voltage 106 to a core cell gate 107 which can be used as a boosted word line voltage for a read mode operation.

Figure 2:
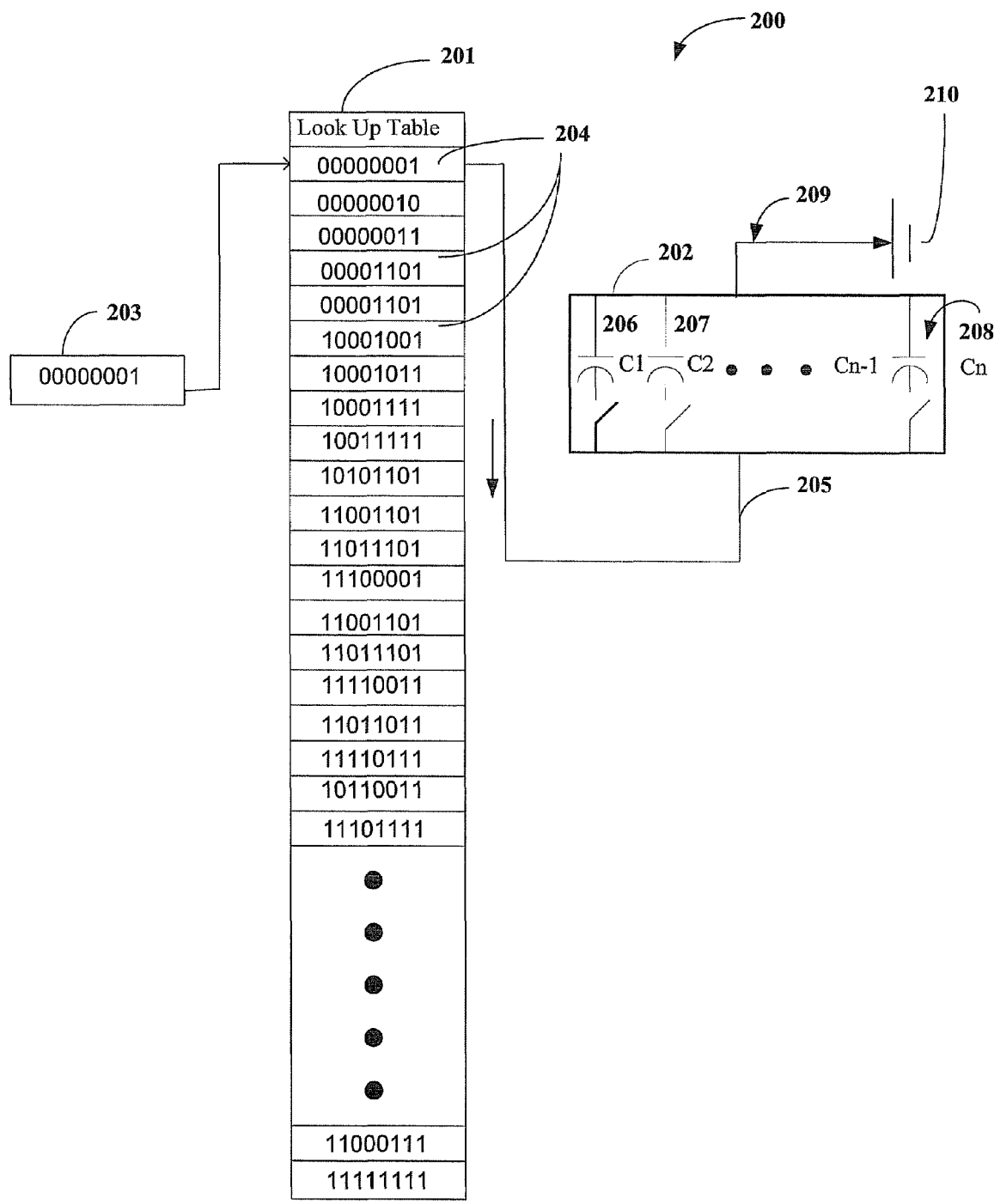
FIG. 2 illustrates operation of a look up table and a boosting circuit in accordance with one aspect of the invention.

FIG. 2 illustrates operation of a look up table 201 and a boosting circuit 202. The look up table 201 contains a set of any suitable member of trim codes, for example, a set of 8 bits codes. The look up table 201 has a list of trim codes 204 (e.g., '00000001', '11011101' . . . ) created by, for example, a circuit engineer. For purposes of explanation and to aid in understanding, the list of trim code 204 is depicted as 8 bits. However, it is to be appreciated that the trim code 204 can be a variety of sizes. Trim codes 204 in the look-up table 201 may indicate desired boosting ratios required to provide a boosted word line voltage for a read mode of operation.

Any suitable boosting ratio can be employed to boost the supply voltage, thereby providing a sufficient word line voltage. The boosting ratio may depend on, for example, the type of memory cells and/or the desired implementations of memory cells. In one embodiment, the boosting circuit 202 boosts the supply voltage 104 by about 30% or more and about 600% or less. In another embodiment, the boosting circuit 202 boosts the supply voltage 104 by about 50% or more and about 500% or less. In yet another embodiment, the boosting circuit 202 boosts the supply voltage 104 by about 70% or more and about 400% or less.

A digital code 203 which is provided by a VCC comparator 101 in FIG. 1 via translating a level of a supply voltage 104 to a digital form can be used as a pointer to access a set of respective trim codes 204 stored in the look up table 201. Thus, the digital code 203 can be matched to one of the trim codes 204 in the look up table 201. For example, the digital code '00000001' 203 can access one of the trim codes '0000001' 204 in the look up table 201.

After the look up table 201 receives the digital code 203 and the digital code 203 is matched to one of the trim code 204, the look up table 201 commands the boosting circuit 202 to boost or not to boost the supply voltage 104 according to the trim code 204. When an amount of supply voltage is relatively high, the look up table 201 commands the boosting circuit 202 not to boost the supply voltage according to the trim code 204. This operation prevents over boosting.

When the supply voltage 104 is not high enough to exceed a read voltage threshold of a memory cell, the look up table 201 commands the boosting circuit 202 to boost the supply voltage 104. According to the trim code 204 that is matched with the level of the supply voltage 104, the look up table 201 sends a boosting circuit 202 a different boosting ratio to boost the supply voltage 104 for providing a sufficient word line voltage 209 to a core cell gate 210. A boosting ratio can vary depending on the level of the supply voltage 104.

The boosting circuit 202 contains a set of boosting capacitors (n capacitors) 206, 207, 208. Any suitable number of capacitors can be predetermined to be turned on or off according to the trim code 204. The number of the capacitors that are turned on may depend on, for example, the desired boosting ratio and/or the desired implementations. For example, when a trim code '00000001' is sent to the boosting circuit, one capacitor is turned on. In another embodiment, when a trim code '00000010' is sent to the boosting circuit, three capacitors are turned on. In yet another embodiment, when a trim code '11011101' is sent to the boosting circuit, five capacitors are turned on.

A voltage boosting process in the boosting circuit 202 occurs by charging or storing charge in a storage element such as a boosting capacitor 206, 207, 208. When the boosting circuit 202 receives a command based on the trim code 204 from the look up table 201, a predetermined set of boosting capacitors (e.g., one capacitor, three capacitor, ten capacitors) 206, 207, 208 are turned on in the boosting circuit 202 according to the trim code 204. Once the boosting capacitors 206, 207, 208 are charged and turned on, the boosting capacitors 206, 207, 208 can connect to the input voltage node 205, which then produces a boosted voltage 209. The boosted voltage 209 presents a voltage potential greater than a level of a supply voltage 104.

For example, if a supply voltage 104 of 2.5V, which is not high enough to exceed a read voltage threshold of a memory cell, is applied to a VCC comparator 101, the VCC comparator 101 converts the supply voltage 104 of 2.5V into a digital code 203, (e.g., '00000001') based on the level of the supply voltage 104. The digital code 203 is sent to the look up table 201 and can be match to one of the trim codes '00000001' 204 in the look up table 201. The trim code '00000001' 204 may indicate a boosting ratio to boost the supply voltage by about 100%.

According to the boosting ratio of about 100%, the look up table 201 commands the boosting circuit 202 to boost the supply voltage 104 by about 100%. When the trim code '00000001' 203 is sent to the boosting circuit 202, a predetermined set of boosting capacitors, for example, two capacitors 206, 207 are turned on in the boosting circuit 202 to boost the supply voltage 104 by about 100%. Thus, the boosting circuit 202 produces a boosted voltage 5V which is the read voltage threshold of the memory cell. The boosted voltage is sent to a core cell gate 210 and is used as a boosted word line voltage for a read mode operation.

Figure 3:
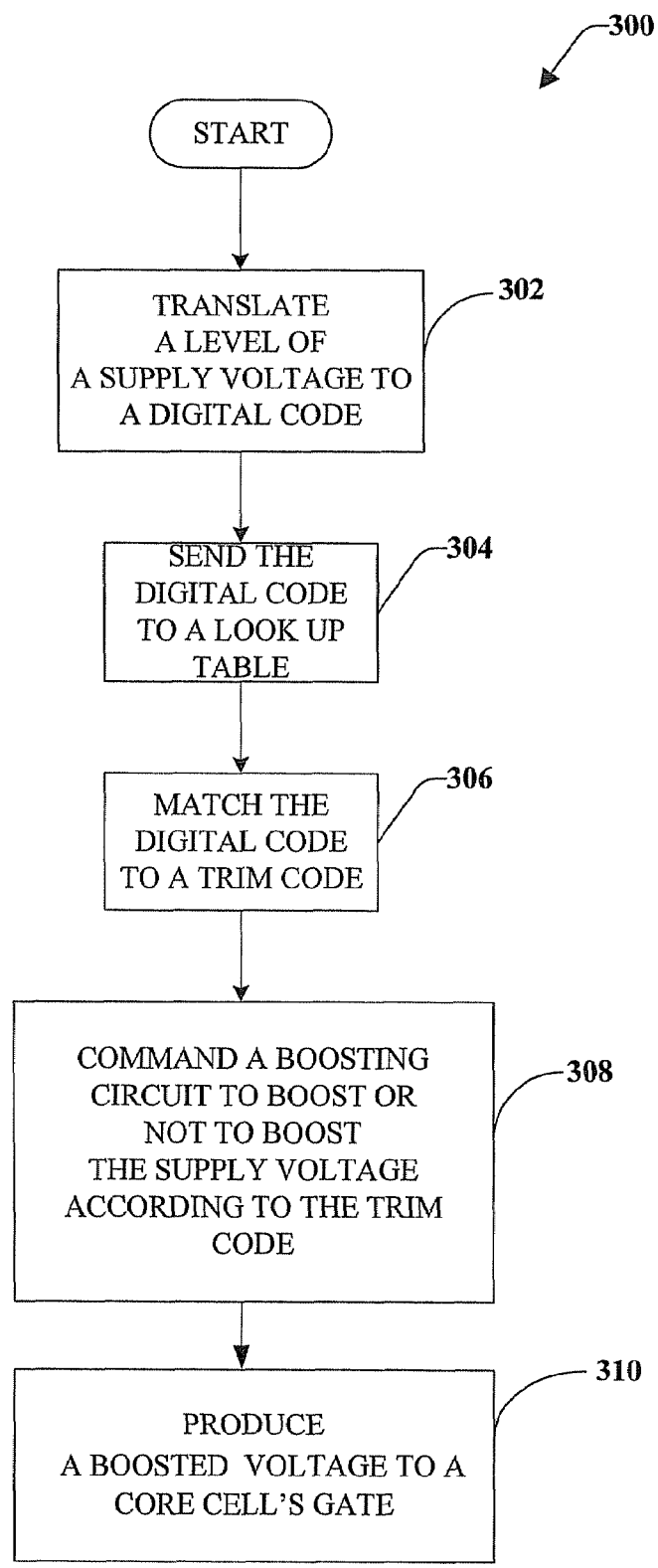
FIG. 3 illustrates a flow diagram of a method of producing a boosted voltage which is used as a boosted word line voltage for read mode operations in accordance with one aspect of the invention.

Referring to FIG. 3, a flow diagram of a method 300 of producing a boosted voltage which is used as a boosted word line voltage for read mode operations of memory cells is depicted. The method 300 can be employed to operate a VCC comparator, a look up table, and a boosting circuit. At reference number 302, a level of a supply voltage is converted to a digital code by a VCC comparator. At reference number 304, the digital code is sent to a look up table. At reference number 306, the digital code can be matched to one of a list of trim codes stored in the look up table. At reference number 308, the look up table commands a boosting circuit to boost or not to boost the supply voltage according to the trim code. When the supply voltage is not high enough to exceed a read voltage threshold of a memory cell, the look up table commands the boosting circuit based on the trim code to boost the supply voltage. When the boosting circuit receives a boosting command from the look up table, a predetermined set of boosting capacitors are turned on in the boosting circuit according to the trim code. The number of the capacitors that are turned on may depend on the desired boosting ratio.

What is described above includes examples of the innovation. It is, of course, not possible to describe every conceivable combination of components or methodologies for purposes of describing the innovation, but one of ordinary skill in the art may recognize that many further combinations and permutations of the innovation are possible. Accordingly, the innovation is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising: is interpreted when employed as a transitional word in a claim.

What is claimed is:

1. A method for producing a boosted voltage for read operations of a memory cell, comprising:
   providing a digital code by a VCC comparator according to a level of a supply voltage;
   sending the digital code to a look up table;
   matching the digital code to a trim code in the look up table; and
   commanding a boosting circuit to boost or not to boost the supply voltage according to the trim code.

2. The method of claim 1, wherein the VCC comparator measures the supply voltage.

3. The method of claim 1, wherein the VCC comparator encodes the supply voltage.

4. The method of claim 1, wherein the VCC comparator translates the supply voltage to the digital code.

5. The method of claim 1, wherein the digital code from the VCC comparator comprises n bits and the digital code is determined by the level of the supply voltage.

6. The method of claim 1, wherein the digital code is used as a pointer to access a set of trim codes stored in the look up table.

7. The method of claim 1, wherein the digital code is matched to the one of the trim codes in the look up table.

8. The method of claim 1, wherein the trim code indicates a boosting ratio which varies depending on the level of the supply voltage.

9. The method of claim 1, wherein the boosting ratios determine boosting capacitors settings in a boosting circuit.

10. The method claim 1, wherein commanding the boosting circuit comprises turning on a predetermined set of boosting capacitors according to the trim code.

11. The method of claim 1, wherein the boosting circuit receives a command whether boost or not to boost the supply voltage based on the trim code.

12. The method of claim 8, wherein the boosting circuit produces a boosted voltage according to the desired boosting ratio.

13. The method of claim 1, further comprising using the boosted voltage as a boosted word line voltage for read mode operations of memory cells.

14. The method of claim 1, further comprising the boosted voltage to the core cell gate.

15. A system for producing a boosted voltage in a memory device, comprising:
   a VCC comparator that translates a supply voltage to a digital code;
   a look up table that matches the digital code to a trim code; and
   a boosting circuit that boosts the supply voltage according to the trim code.

16. The system of claim 15, wherein the digital code of the VCC comparator is a binary signal.

17. The system of claim 15, wherein the digital code comprises a set of digital number of 1 or 0.

18. The system of claim 15, wherein the look up table comprises a list of trim codes.

19. The system of claim 15, wherein the boosting circuit comprises a set of boosting capacitors.

20. A system that produces a boosted voltage, comprising:
   means for translating a level of a supply voltage to a digital code;
   means for sending the digital code to a look up table;
   means for matching the digital code to a trim code; and
   means for commanding a boosting circuit to boost or not to boost the supply voltage based on the trim code.

* * * * *